(12) United States Patent
Naitou et al.

(10) Patent No.: US 7,271,605 B2
(45) Date of Patent: Sep. 18, 2007

(54) BURN-IN APPARATUS

(75) Inventors: Takashi Naitou, Tokyo (JP); Atsuyuki Doi, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/455,850

(22) Filed: Jun. 20, 2006

(65) Prior Publication Data
US 2006/0238188 A1 Oct. 26, 2006

Related U.S. Application Data

(63) Continuation of application No. PCT/JP05/02282, filed on Feb. 15, 2005.

(51) Int. Cl.
*G01R 31/02* (2006.01)
(52) U.S. Cl. ...................................... 324/760
(58) Field of Classification Search ................ 324/760, 324/765, 754–756, 158.1; 356/399
See application file for complete search history.

(56) References Cited

U.S. PATENT DOCUMENTS

| | | | |
|---|---|---|---|
| 6,104,183 A * | 8/2000 | Kobayashi et al. ...... | 324/158.1 |
| 6,307,388 B1 | 10/2001 | Friedrich et al. | |
| 6,313,652 B1 * | 11/2001 | Maeng ........................ | 324/760 |
| 6,340,895 B1 * | 1/2002 | Uher et al. .................. | 324/755 |
| 6,349,396 B2 * | 2/2002 | Akram ........................ | 714/724 |
| 6,426,508 B1 * | 7/2002 | Kosugi et al. ............... | 250/548 |
| 6,563,331 B1 * | 5/2003 | Maeng ........................ | 324/760 |
| 6,744,269 B1 * | 6/2004 | Johnson et al. ............. | 324/760 |
| 6,815,966 B1 * | 11/2004 | Gunn et al. .................. | 324/760 |

FOREIGN PATENT DOCUMENTS

JP A-10-213624 8/1998
JP A-2001-264386 9/2001

OTHER PUBLICATIONS

International Search Report dated Jun. 7, 2005 for corresponding Japanese Application PCT/JP21005/002282.

* cited by examiner

*Primary Examiner*—Ha Tran Nguyen
*Assistant Examiner*—Joshua Benitez
(74) *Attorney, Agent, or Firm*—Posz Law Group, PLC

(57) ABSTRACT

A burn-in apparatus for conducting a burn-in test by housing a burn-in board mounted with a large number of DUT in a burn-in chamber, moving a temperature adjustment board downward and bringing temperature adjustment arrays attached to the temperature adjustment board contact with corresponding DUT; comprising a push-pull device having a movable body moving back and forth in the horizontal direction of a board surface of the burn-in board and a cam mechanism composed of a tilted cam and cam follower for elevating/lowering an elevator board by converting a back-and-forth movement of the movable body to a vertical movement is provided; wherein the push-pull device for elevating/lowering the temperature adjustment board can be downsized, so that a more compact burn-in apparatus can be provided.

26 Claims, 11 Drawing Sheets

BURN-IN APPARATUS

CROSS REFERENCE TO RELATED APPLICATIONS

This application is a continuation of PCT/JP2005/002282, filed on Feb. 15, 2005, the contents of which are incorporated herein by reference.

BACKGROUND OF THE INVENTION

1. Field of the Invention

The present invention relates to a burn-in apparatus for conducting a burn-in test of a variety of electronic devices, and particularly relates to a burn-in apparatus for conducting a burn-in test of a large number of electronic devices at a time.

2. Description of the Related Art

A burn-in test is a kind of screening tests, which detects initial failures of electronic devices by imposing a high temperature thermal stress on the electronic devices, such as semiconductor integrated circuits, for a long time to take away initial defectives. As a burn-in apparatus for conducting such a test, those having a burn-in chamber for housing a burn-in board loaded with a large number of electronic devices to be tested and maintaining a high temperature state so as to conduct a test in the burn-in chamber are known.

Recently, a burn-in apparatus for placing a burn-in board loaded with a large number of electronic devices at a predetermined position in a burn-in chamber, then, conducting a burn-in test of the electronic devices while giving a thermal stress and adjusting a temperature of each electronic device by brining temperature adjusting arrays contact with the respective electronic devices has been proposed (The Japanese Patent Application No. 2004-79623).

In the burn-in chamber of the burn-in apparatus, the temperature adjusting arrays are provided by the number capable of contacting one-to-one with electronic devices. The temperature adjusting arrays are attached to a temperature adjusting board provided to be movable up and down in the burn-in chamber. Then, in the burn-in test, a plurality of temperature adjusting boards are moved vertically at a time to bring the temperature adjusting arrays contact with the respective electronic devices at a time.

SUMMARY OF THE INVENTION

In the above burn-in apparatus, as a method of elevating or lowering the plurality of temperature adjusting boards at a time, for example as shown in FIG. 11, a method of providing air cylinders 101 each provided with a movable rod 101a moving up and down on both sides of the burn-in chamber 102 and elevating or lowering the temperature adjusting boards 103 by using them may be considered.

However, when there are a large number of temperature adjusting boards to be elevated or lowered at a time, the entire movable portion has to be driven to be elevated or lowered collectively by a drive force of several thousands of N (kg·m/s$^2$). Therefore, large air cylinders have to be used and there arises a disadvantage that the burn-in chamber for maintaining a high temperature condition becomes large.

Also, in the burn-in apparatus, it is preferable that the burn-in board is surely inserted to a connector for aligning to be at a correct position. When inserting of the burn-in board into the connector is insufficient, electric connection becomes defective. Also, when aligning of the burn-in board is insufficient, there arise a defect in a guide for alignment of the temperature adjusting array with electronic device to be tested and a trouble of interfering with peripheral sockets. These are the same also in the case where a large number of burn-in boards can be housed.

As shown in FIG. 12, in a burn-in apparatus having a burn-in chamber 102 capable of housing a large number of burn-in board 111, position detection is collectively performed on all burn-in boards 111 in the related art. For example, the burn-in chamber 102 is provided with a sensor composed of a laser irradiation portion 112 attached on top thereof and a laser light receiving portion 113 attached to the bottom thereof. Also, a slit 111a for position detection is formed at a predetermined part of each burn-in board 111 to be housed in the burn-in chamber 102. Then, after housing all burn-in boards 111 and fitting connectors on the burn-in board 111 side in connectors on the burn-in apparatus side, a laser light is irradiated from the laser irradiation portion 112 and, when the laser light passed through slits 111a of all burn-in boards 111 are received by the laser light receiving portion 113, positions of the all burn-in boards 111 are detected to be correct. As explained above, a laser light passes through a plurality of detection slits 111a in the detection means of the related art.

However, when there is production unevenness in a shape, etc. of the housing portion of the respective burn-in boards or installing of connectors, positional deviation caused by the unevenness may arise between slits of the respective burn-in board when fitting the burn-in boards in the connectors. Since the positional deviation cannot be corrected, in the detection means for passing a laser light through a plurality of detection slits of the related art, positional adjustment and angle adjustment of the laser irradiation portion 112 and the laser light receiving portion 113 are not enough as countermeasures thereto in some cases. In that situation, position detection accuracy of the burn-in boards 111 is hard to be improved and, particularly, an improvement of the detection accuracy becomes more difficult as the number of burn-in boards 111 to be housed becomes larger.

When a position of a burn-in board 111 deviates, connection resistance of a connector to be fitted with increases to lead to disadvantages that a power source terminal is heated or deteriorated, moreover, temperature adjustment arrays interfere with sockets or contact them in a deviated state when bringing the temperature adjustment arrays contact with electronic devices loaded on the burn-in board 111, so that temperature control may vary when heating or cooling the electronic devices to be tested and the test quality may not be maintained.

An object of the present invention is to provide a burn-in apparatus able to be made compact and a burn-in apparatus with an improved alignment accuracy of burn-in boards housed in a burn-in chamber.

To attain the above object, first, according to the present invention, there is provided a burn-in apparatus comprising a burn-in chamber for housing a burn-in board mounted with a plurality of electronic devices to be tested, a temperature adjustment board having a plurality of temperature adjustment arrays for heating/cooling the electronic devices by pressing and contacting the electronic devices, and an elevator device for moving the temperature adjustment board up and down in the burn-in chamber; for conducting a burn-in test by housing the burn-in board in the burn-in chamber and, then, moving the temperature adjustment board in the direction of the burn-in board to bring the temperature adjustment arrays contact with electronic devices by pressing against them;

wherein the elevator device comprises a push-pull device having a movable body which moves back and forth in the horizontal direction and a cam mechanism comprising a tilted cam and a cam follower for converting a back-and-forth movement of the movable body to a vertical movement to move the temperature adjustment board up and down (the invention 1).

In the above invention (invention 1), since the cam mechanism composed of a cam follower and a tilted cam is used, a ratio of a distance of elevating/lowering a temperature adjustment board to a moving distance of a movable body can be made small, so that only a small force is necessary for the elevating/lowering operation. Accordingly, when using a tilted cam, particularly, a tilted cam having a small tilting angle, the same weight can be elevated/lowered by a downsized push-pull device comparing with that in the case of providing a push-pull device moving in the vertical direction. Namely, according to the present invention, the push-pull device can be downsized and the burn-in apparatus can be downsized.

In the above invention (invention 1), preferably, the tilted cam of the cam mechanism has a grooved cam tilted part for converting a back-and-forth movement to a vertical movement by cooperating with the cam follower; a first horizontal part continuing from one end of the grooved cam tilted part and extending in the horizontal direction is formed at one of both ends of the grooved cam tilted part on the side where the cam follower positions when a driven side member of the vertically movable cam mechanism positions at the uppermost position (invention 2).

According to the above invention (invention 2), by furthermore moving the main driving side member of the cam mechanism from the state where the cam follower positions at the other end of the grooved cam tilted part, the cam follower can position at the first horizontal part continuing to the other end of the grooved cam tilted part while keeping the temperature adjustment board at the uppermost position. When the cam follower positions at the first horizontal part, the temperature adjustment board can be kept at the uppermost position mechanically without giving any force to the cam mechanism by the push-pull device because of the configuration of the cam mechanism.

The state that the temperature adjustment board positions at the uppermost position indicates a state that the temperature adjustment arrays of the temperature adjustment board is away from electronic devices to be tested on the burn-in board and, for example, the burn-in board can be taken in and out in that state. When not conducting a test or taking in or out a burn-in board, the temperature adjustment arrays has to be away from the electronic devices to be tested, but if the temperature adjustment board can be kept at the uppermost position mechanically, the distant state can be maintained even when the push-pull device stops due to the configuration of the cam mechanism. Also, it is possible to support the temperature adjustment board at the uppermost position regardless of an operation state of the push-pull device, a countermeasure for a power failure becomes unnecessary, which is preferable.

In the above invention (invention 1), preferably, the tilted cam of the cam mechanism has a grooved cam tilted part for converting a back-and-forth movement to a vertical movement by cooperating with the cam follower; a second horizontal part continuing from one end of the grooved cam tilted part and extending in the horizontal direction is formed at one of both ends of the grooved cam tilted part on the side where the cam follower positions when a driven side member of the vertically movable cam mechanism positions at the lowermost position (invention 3).

According to the above invention (invention 3), by furthermore moving the main driving side member of the cam mechanism from the state where the cam follower positions at one end of the grooved cam tilted part, the cam follower can position at the second horizontal part continuing to the end of the grooved cam tilted part while keeping the temperature adjustment board at the lowermost position. When the cam follower positions at the second horizontal part, the temperature adjustment board can be kept at the lowermost position mechanically without giving any force to the cam mechanism by the push-pull device because of the configuration of the cam mechanism.

The state that the temperature adjustment board positions at the lowermost position indicates a state of conducting a burn-in test by pressing the temperature adjustment arrays of the temperature adjustment board against electronic devices to be tested on the burn-in board. In a burn-in test, the temperature adjustment arrays has to contact with the electronic devices for a certain time, if the temperature adjustment board can be kept mechanically at the lowermost position, a state of pressing the temperature adjustment arrays against the electronic devices to be tested can be maintained due to the configuration of the cam mechanism and it is possible to continue the test. Also, the temperature adjustment board can be supported at the lowermost position regardless of an operation state of the push-pull device. Therefore, it is possible to prevent a disadvantage that the temperature adjustment arrays pressing and cooling the electronic devices to be tested become away from the electronic devices to be tested due to an accidental power failure to result in abrupt temperature rising of the electronic device. Accordingly, a countermeasure for a power failure is not necessary, which is preferable.

In the above invention (invention 1), preferably, the push-pull device and the cam mechanism are respectively provided on both sides of the burn-in chamber, a movable body of the push-pull device is attached with at least one main driving side member of the cam mechanism moving back and forth in the horizontal direction, and a main driving side member connected to one movable body and a main driving side member connected to the other movable body are mutually connected by a connection member provided to be able to move back and forth in the horizontal direction (invention 4).

In the above invention (invention 4), the main driving side members positioning on both sides of the burn-in chamber by sandwiching the temperature adjustment board from both sides are mutually connected by a connection member. Therefore, the main driving side members on the both sides of the temperature adjustment board can move in synchronization. When the main driving side members on the both sides of the temperature adjustment board can be moved in synchronization, the temperature adjustment board can be elevated/lowered in a stable state. Also, the burn-in chamber normally has a configuration of taking in and out burn-in boards in the horizontal direction, and a space for providing the connection member movable in the horizontal direction is easily secured in the burn-in chamber. Accordingly, when providing a push-pull device in the state that the movable body moves in the horizontal direction as in the present invention (invention 4), it is possible to synchronize the main driving side members of the cam mechanism by providing a connection member moving in the horizontal direction and connecting to each other.

In the above invention (invention 1), preferably, the cam follower of the cam mechanism contacts a surface of a grooved cam of the tilted cam by rolling thereon (invention 5). According to the invention, an elevating/lowering operation of the temperature adjustment board is stabilized because a friction of converting a back-and-forth movement to a vertical movement is reduced by the cam mechanism. Also, when the friction is reduced, an output of the drive means can be effectively transferred to the temperature adjustment board side, so that the drive means can be downsized.

Secondary, according to the present invention, there is provided a burn-in apparatus comprising a burn-in chamber for housing a plurality of burn-in boards mounted with a plurality of electronic devices to be tested, detectors for detecting positions of the burn-in boards, a temperature adjustment board freely movable in the vertical direction, a plurality of temperature adjustment arrays attached to the temperature adjusting board; for housing the burn-in boards in the burn-in chamber, detecting by the detectors that the burn-in board positions at a predetermined position, then, moving the temperature adjustment board to bring the temperature adjustment arrays contact with electronic devices to be tested;

wherein the detectors are provided to be in one-to-one correspondence with respective burn-in boards to be housed in the burn-in chamber, and each individual detector performs position detection of each burn-in board (invention 6).

In the above invention (invention 6), since an individual detector detects a position of each burn-in board, it is sufficient if each detector detects only an insertion position of the corresponding burn-in board. When there is one detection object, a position, etc. of a detector can be set according only to the object, so that position detection at higher accuracy can be attained. For example, when trying to perform position detection of a burn-in board inserted to a slot of the burn-in chamber and inserted to a connector at higher accuracy, it becomes necessary to consider a size of each slot, a fitting amount of the connector on the burn-in chamber side and a connector of the burn-in board, and other precise difference. In terms of this, when a detector is provided to each slot, the difference can be individually considered for each slot to adjust a position of the detector, so that position detection of inserted burn-in boards can be performed with higher accuracy. As a result, when pressing the temperature adjustment arrays against electronic devices, interference of the temperature adjustment arrays with sockets around the DUT is prevented, etc. so that the operation of contacting can be performed surely in a stable state.

In the above invention (invention 6), preferably, a detector for detecting an insertion position of the burn-in board is a photo micro sensor comprising a light irradiating portion and a light receiving portion (invention 7). Since photo micro sensors are inexpensive, a detector can be provided at a low cost even when the number to be installed is large.

In the above invention (invention 6), preferably, the photo micro sensor is a type that turns on when a light enters (invention 8). In a burn-in apparatus capable of conducting a burn-in test of predetermined number of electronic devices, when conducting a burn-in test of a smaller number of electronic devices, burn-in boards do not always have to be inserted to all slots. In that case, when using photo micro sensors of a type that turns on when a light is blocked, it is necessary to insert dummy boards to all empty slots to make a light-blocked state and have the detectors detects the positions. While, when a photo micro sensor of a type that turns on when a light enters is used, it turns on even if the slot is left empty, so that unused slots may be left empty and the operating efficiency at the time of a burn-in test improves. Note that when using a photo micro sensor of a type that turns on when a light enters, a slit, a though hole or other penetrated part is formed at a predetermined position of the burn-in board. When the burn-in board is inserted correctly, a light from the light irradiating portion of the photo micro sensor passes through the penetrated part to reach the light receiving portion, the photo micro sensor turns on, while when a burn-in board is not inserted, the photo micro sensor again turns on as explained above.

In the above invention (invention 6), preferably, the photo micro sensor detects a position of a notch or a through hole formed on a burn-in board (invention 9). According to the invention (invention 9), photo micro sensors may be applied with a simple configuration.

In the above invention (invention 6), preferably, a position of setting the detector is close to an opening of a burn-in board slot provided to the burn-in chamber (invention 10).

According to the above invention (invention 10), when a burn-in board is not fully inserted, it can be surely detected. Namely, position detection of the burn-in board can be performed with high accuracy. In the case of a photo micro sensor of a type that turns on when a light enters, when a position of the detector is close to the back in the insertion direction of the burn-in board, the laser light receiving portion turns on when the insertion is incomplete in some cases. Probability of arising of such an error becomes high as the position of attaching the detector gets close to the back. Accordingly, the position of the detector is preferably close to the opening of the slot of the burn-in chamber. Also, when the detector is near the opening, attaching, removing and position adjustment of the detector are easy, which is advantageous in terms of maintenance.

In the above invention (invention 6), preferably, a position of the detector can be adjusted (invention 11).

When a position of the detector can be adjusted, the position of the detector can be determined to a more suitable position in accordance with the burn-in apparatus and a state of burn-in board to be inserted, so that alignment accuracy of the burn-in boards improves.

In the above invention (invention 6), preferably, a position adjustment mechanism having a slider attached to the detection unit, a guide member for guiding the slider to move back and forth, a jig for alignment able to be fixed to the guide member in a state of being relatively movable back and forth with respect to the guide member and made to hit the detection unit, and a biasing means for biasing the detection unit toward the jig are included;

wherein, when a relative position of the jig hitting the detection unit with respect to the guide member is adjusted, a position of the detection unit in the back-and-forth direction is adjusted (invention 12).

A position of the detector may be determined by pressing the detector against the standard surface by using an alignment jig having a standard surface may be also considered, however, a processing error of the jig and an outer shape error to the photo micro sensor affect in this method, so that highly accurate alignment cannot be attained. While, the position adjustment mechanism of the above invention (invention 12) is configured to sandwich the detection unit by the alignment jig and biasing means, so that the detection unit can be easily aligned by adjusting a relative position of the jig with respect to the guide member. Note that a spring and rubber may be used as the basing means.

In the above invention (invention 12), preferably, the jig for alignment is a feeding screw screwed with the guide member and a tip thereof is to be hit the detection unit and, when a position of screwing the feeding screw on the guide member is adjusted, a position of the detection unit in the back-and-forth direction is adjusted (invention 13). The screw mechanism is suitable for fine adjustment of a position and, when a feeding screw is used as an alignment jig, the detection unit can be aligned with high accuracy. When the detection unit can be aligned with high accuracy, the burn-in board to be housed in the burn-in chamber can be aligned with higher accuracy.

Thirdly, according to the present invention, there is provided a burn-in apparatus for conducting a test by housing in a burn-in chamber a plurality of burn-in boards capable of mounting a plurality of electronic devices to be tested, a temperature adjustment board having a plurality of temperature adjustment arrays for heating/cooling the electronic devices by pressing and contacting the electronic devices, and an elevator device for moving the temperature adjustment board up and down;

wherein the temperature adjustment arrays are arranged on the temperature adjustment board to face the electronic devices to be tested in an arrangement corresponding to an arrangement of the electronic devices so as to be able to heat/cool the electronic devices individually; and the elevator device comprises a push-pull device having a movable body for moving back and forth by a drive source and a cam mechanism for converting a drive force in the back-and-forth direction of the movable body, moves the temperature adjustment board in the burn-in board direction by a drive force converted by the cam mechanism and brings the temperature adjustment arrays press against the electronic devices to contact them (invention 14).

In the above invention (invention 14), since the cam mechanism is used, a ratio of an elevating/lowering distance of the temperature adjustment board to a moving distance of the movable body can be small, only a small force is necessary for the elevating/lowering operation. Accordingly, when using a tilted cam, particularly, a tilted cam having a small tilting angle in the cam mechanism, the same weight can be elevated/lowered by a downsized push-pull device comparing with that in the case of providing a push-pull device moving in the vertical direction. Since the temperature adjustment board to be elevated/lowers is arranged a large number of temperature adjustment arrays corresponding to respective electronic devices and, moreover, a plurality of temperature adjustment boards are normally mounted, a drive force for elevating/lowering the plurality of temperature adjustment boards collectively becomes as large as several thousands of N (kg·m/s$^2$), however, downsizing of the push-pull device is also desired. According to the above invention (invention 14), the push-pull device can be downsized and, moreover, the burn-in apparatus can be downsized.

In the above invention (invention 14), preferably, the cam mechanism converts a drive force of the movable body in the back-and-forth direction to a direction perpendicular to the back-and-forth direction and drives an elevator plate by a converted drive force; and the elevator plate moves the temperature adjustment board back and forth with respect to the burn-in board (invention 15).

When the direction of a drive force before conversion and the direction of the drive force after conversion are at right angles to each other, there are advantages that a drive force to be obtained after the conversion may be a desired force by changing a condition of a shape of the cam (for example, a tilting angle of the groove in the case of a grooved cam), and a speed of elevating/lowering the elevator plate can be easily changed.

In the above invention (invention 14), preferably, an alignment pin is provided to the temperature adjustment board for mutually aligning the temperature adjustment board with the burn-in board, and the burn-in board is provided with a guide hole for guiding the alignment pin to fit therein (invention 16). According to the invention, alignment of the temperature adjustment arrays and electronic devices to be tested can be attained more surely.

In the above invention (invention 14), preferably, an elastic body is provided between the temperature adjustment board and the temperature adjustment arrays, so that the temperature adjustment arrays elastically press electronic devices to be tested when the temperature adjustment board approaches the burn-in board (invention 17). As the elastic body, for example, a coil spring and rubber, etc. may be mentioned. By providing such an elastic body, a pressing force by each temperature adjustment array against each electronic device can be unified.

In the above invention (invention 14), preferably, the burn-in chamber comprises a guide groove for guiding the burn-in board to a predetermined housing position and a fitting connector for the housed burn-in board to electrically connect;

the burn-in board comprises flanges guided by the guide groove on its both sides and a connector for fitting with the fitting connector, and a slit is formed on the flanges; and a detector for detecting that the connector of the burn-in board surely fits with the fitting connector of the burn-in chamber by detecting the slit of the burn-in board housed in the burn-in chamber (invention 18).

According to the above invention (invention 18), it is possible to surely detect for each burn-in board that a connector of a burn-in board fits in a fitting connector of the burn-in chamber.

In the above invention (invention 18), preferably, the detector is capable of adjusting a detection position of the slit with respect to a position of the slit (invention 19). According to the invention, even if there is a production unevenness in a shape, etc. of the holder portion of the respective burn-in boards or in installing of connectors or there is a deviation in a position of forming a slit on the burn-in boards, the detection position can be set at a correct position and an accuracy of detecting a slit position can be improved.

In the above invention (invention 14), preferably, the temperature adjustment array is provided with a configuration of cooling the temperature adjustment array by circulating a coolant from the outside and a configuration of heating the temperature adjustment array by a built-in heater (invention 20). According to the invention, wide temperature control of the temperature adjustment arrays and, moreover, electronic devices to be tested becomes possible.

In the above invention (invention 20), preferably, the temperature adjustment array furthermore comprises a temperature sensor, controls one or both of the heater and a flow amount of the coolant based on the temperature sensor, and cools or heats a temperature of a part of the temperature adjustment array contacting with an electronic device to be tested to a predetermined temperature (invention 21). According to the invention, temperature of the temperature adjustment arrays and electronic devices to be tested can be controlled correctly, and burn-in tests under a variety of temperature conditions can be conducted.

BRIEF DESCRIPTION OF DRAWINGS

These and other objects and features of the present invention will become clearer from the following description of the preferred embodiments given with reference to the attached drawings, in which.

DESCRIPTION OF THE PREFERRED EMBODIMENT

Below, an embodiment of the present invention will be explained in detail based on the drawings.

Figure 1:
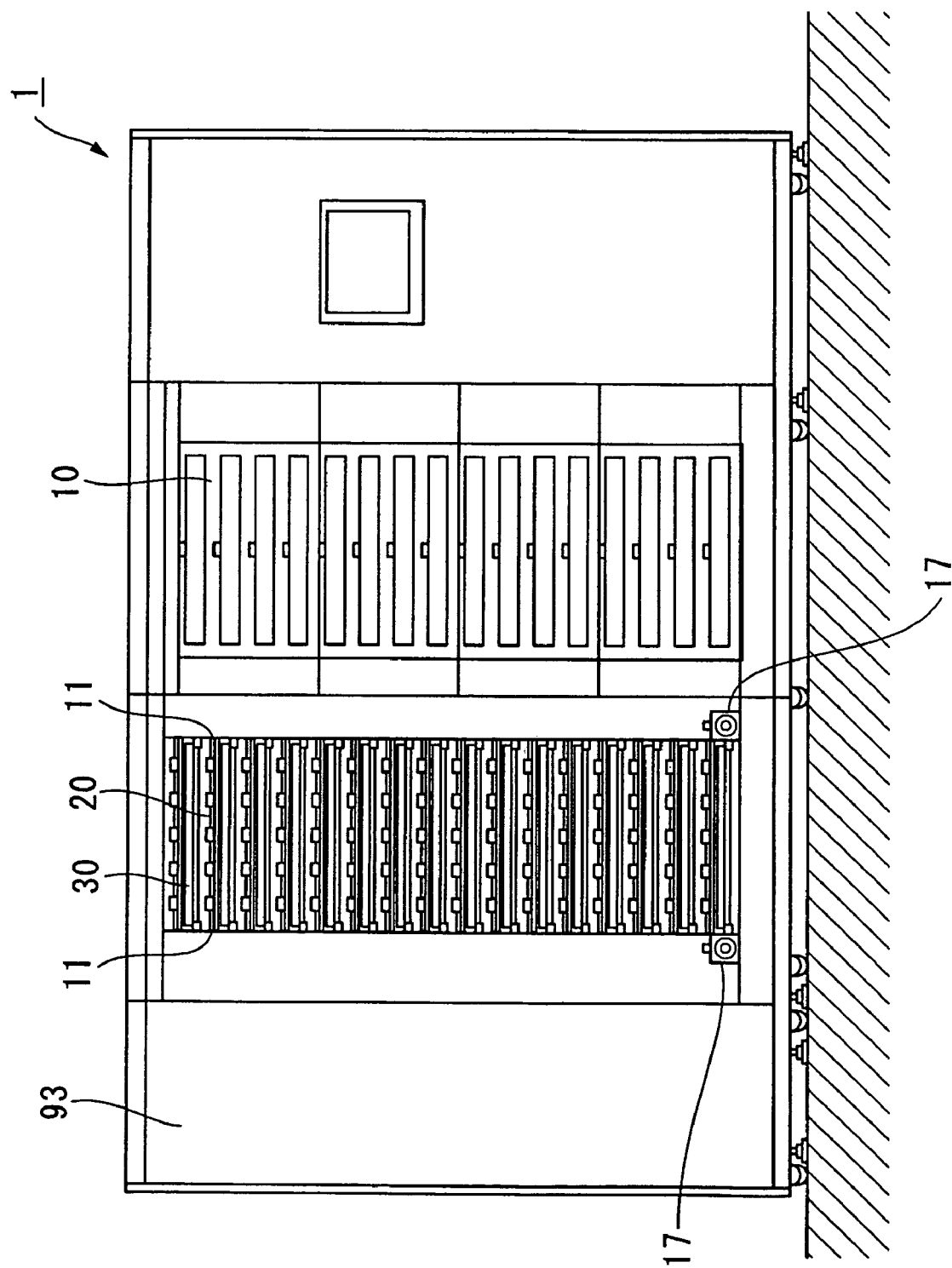
FIG. 1 is a front view of an overall burn-in apparatus according to an embodiment.
Figure 2:
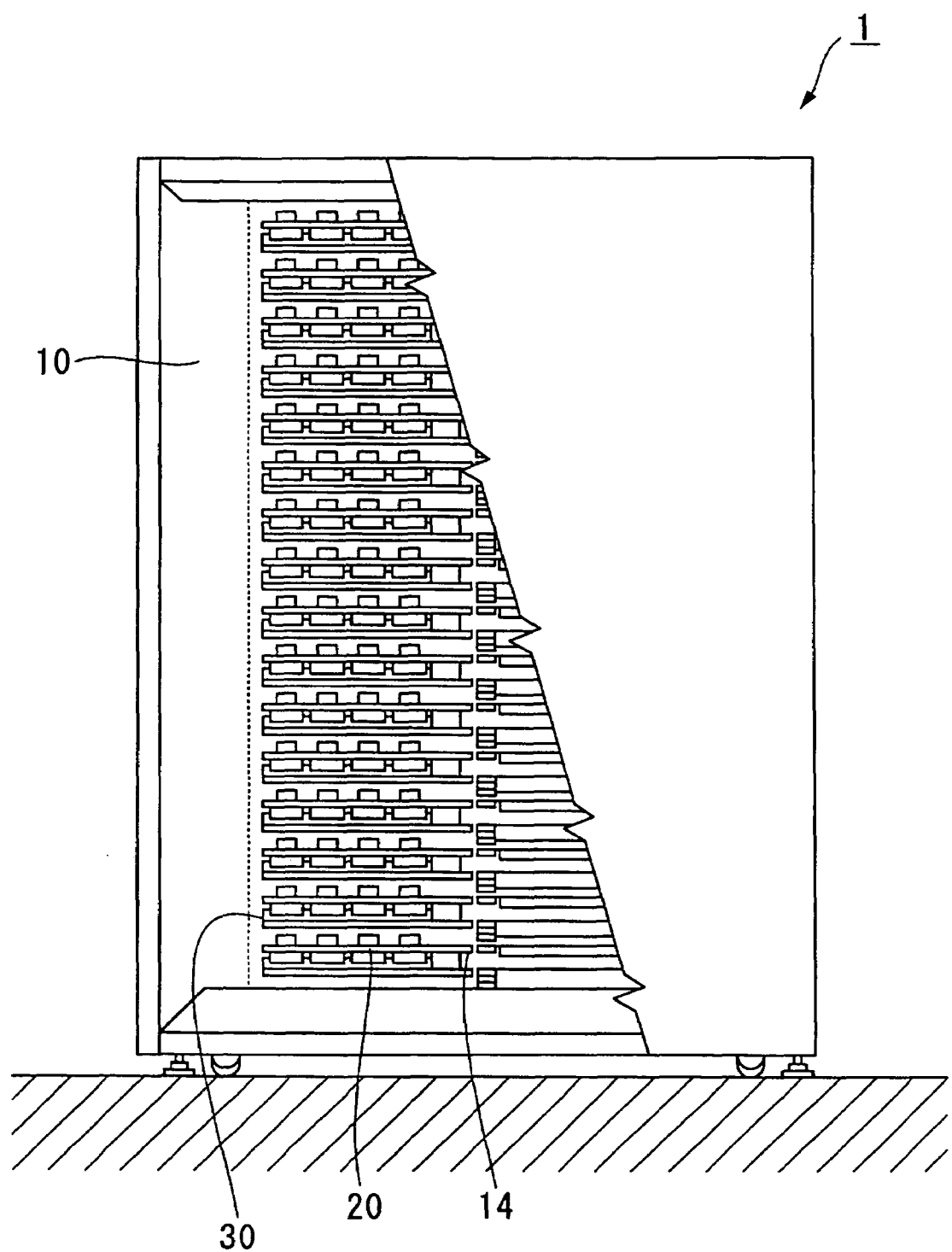
FIG. 2 is a view from the side of the overall burn-in apparatus in FIG. 1.

As shown in FIG. 1 and FIG. 2, the burn-in apparatus 1 according to the present embodiment comprises a burn-in chamber 10 having a door (not shown) to be opened and closed on its front. By opening or closing the door of the burn-in chamber 10, a burn-in board 20 (refer to FIG. 3) can be taken in and out. Note that the burn-in board 20 is to be loaded with a plurality of DUT (devices under tested) typified by IC devices to be subjected to a burn-in test.

Figure 3:
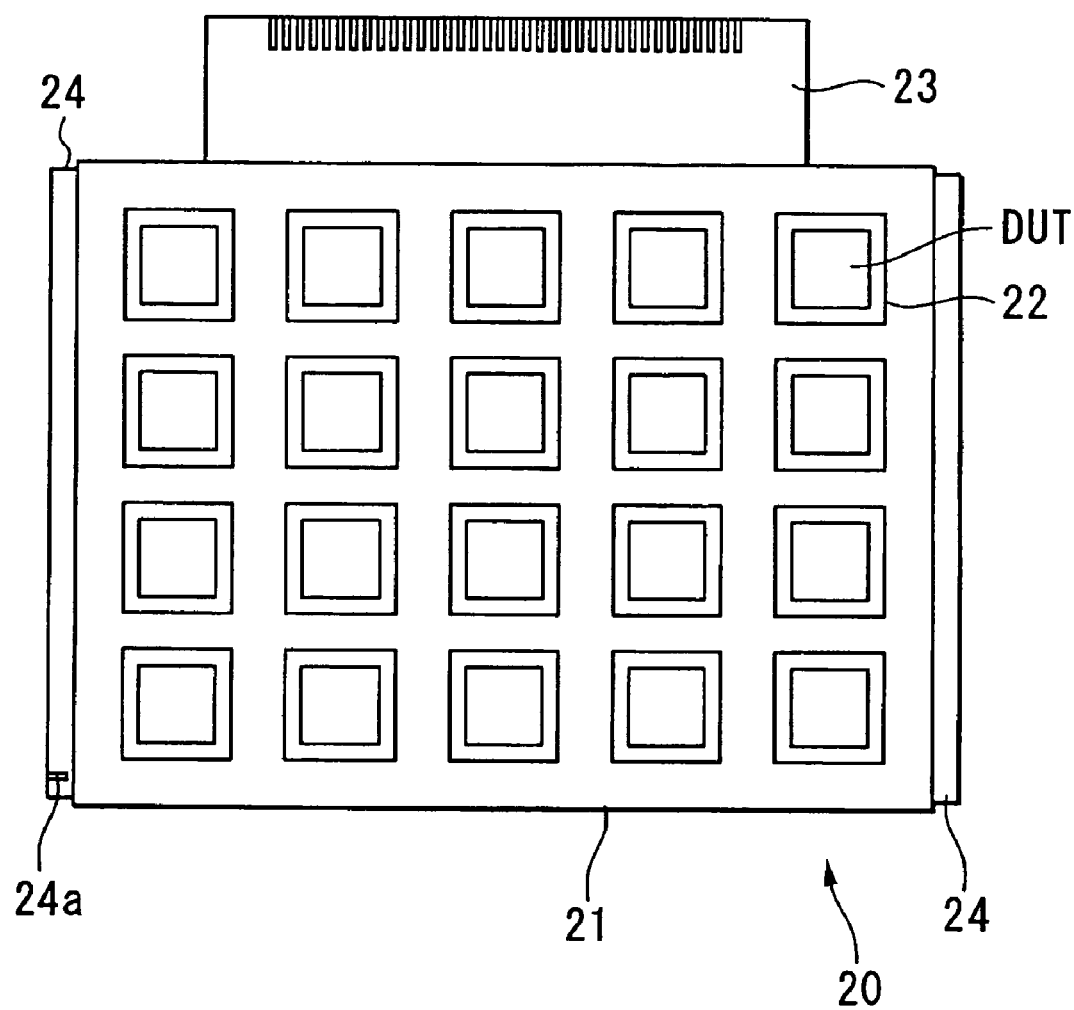
FIG. 3 is a plan view of a burn-in board loaded with devices under test (DUT)

As shown in FIG. 3, the burn-in board 20 to be inserted to the burn-in chamber 10 has a square board body 21 formed by a thermo-resistive material. The board body 21 is provided with, for example, 20 sockets 22 (4 lines by 5 rows), to which DUT are attached. On an outer rim of the far end of the board body 21 is provided with an edge connector 23 for connecting with an external power source and inputting/outputting a control signal. Also, the board body 21 is provided with a signal wire/power source wire (not shown) for electrically connecting the sockets 22 with the edge connector 23. The burn-in board 20 has on its both sides firm flanges 24 for holding the board body 21 and supporting pressure of several tens of kg. One of the flanges 24 is formed a slit 24a to be used for position detection in the burn-in chamber 10. A position of the slit 24a is near the front rim being opposite side of the far end rim provided with the edge connector 23, that is, near an opening of the burn-in chamber 10. Note that a not shown inserting/removing device, inserter/remover or loader/unloader, etc. is used for attachment or exchange operations of DUT to and from the sockets 22.

Figure 4:
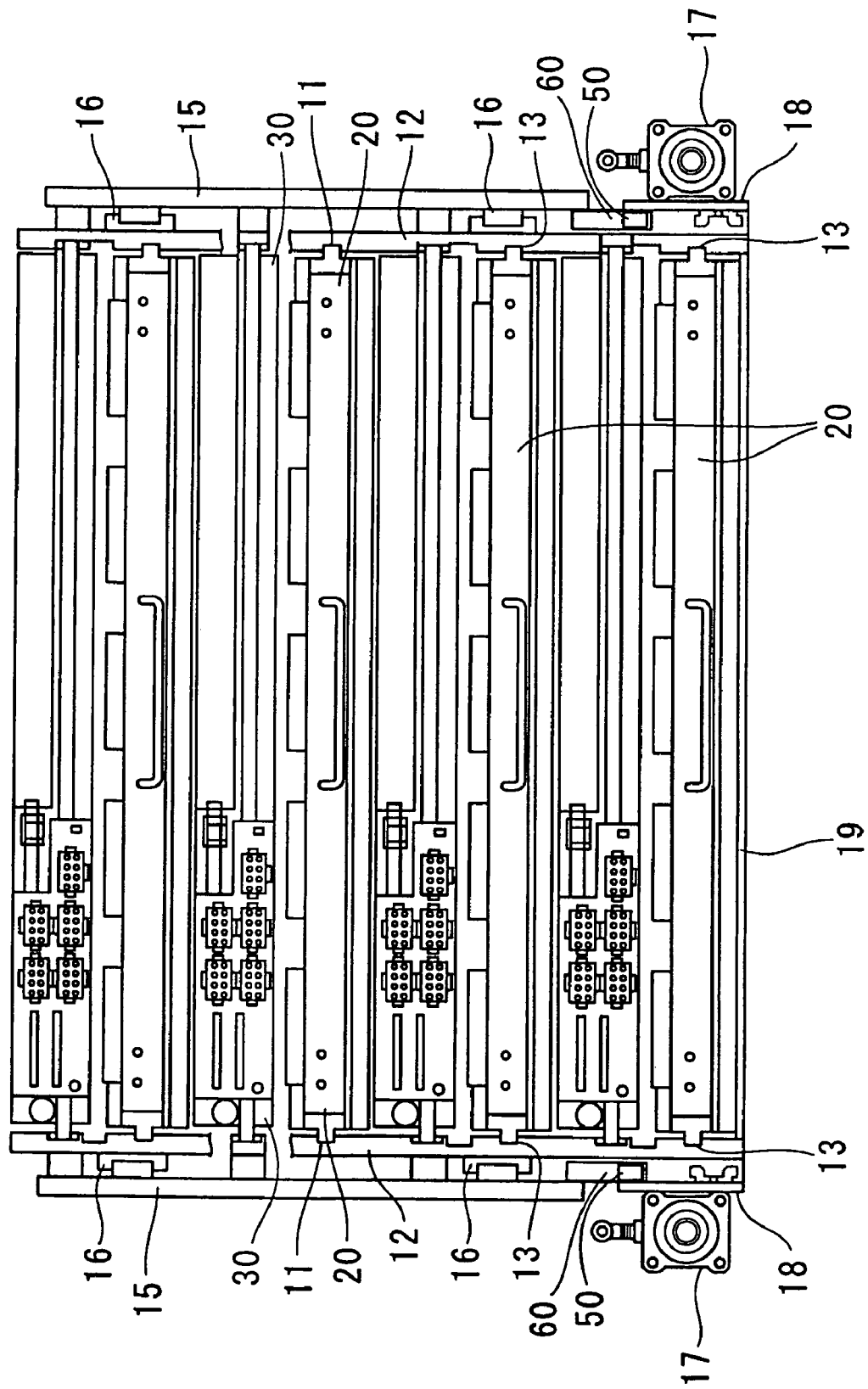
FIG. 4 is an enlarged view from the front of a part of the burn-in apparatus in FIG. 1.

As shown in FIG. 1 and FIG. 4, the burn-in chamber 10 has a plurality of slots 11 for the burn-in boards 20 to be freely inserted (FIG. 4 shows a state that the burn-in boards are inserted to the slots). At positions corresponding to the respective slots 11 on both-side plates 12 of the burn-in chamber 10, guide grooves 13 for supporting side rims (the flanges 24) of the burn-in boards 20 inserted to the slots 11 are formed. The guide grooves 13 extend in the horizontal direction and firmly support the burn-in boards 20 inserted from the front side of the burn-in chamber 10. Note that, as shown in the specific example in FIG. 1, the slots 11 are provided by 16 levels×2 rows, so that a total of 32 burn-in boards 20 can be housed. Inside the burn-in chamber 10, an air controlled to be a predetermined temperature is circulated. Note that temperature control in the chamber by the air circulation may be omitted when temperature control of DUT can be attained only by the temperature adjustment board 30.

Also, at positions corresponding to the respective slots 11 on the back plate of the burn-in chamber 10, connectors 14 (refer to FIG. 2 and FIG. 10) for connecting with the edge connectors 23 of the burn-in boards 20 inserted to the slots 11 are provided. Since the connectors 14 are electrically connected to a power source 90 for DUT and a burn-in controller 91, when the edge connectors 23 of the burn-in boards 20 are connected to the connectors 14, power can be supplied to the DUT mounted on the burn-in boards 10 and a control signal, etc. of a burn-in test can be input and output. Note that the electric connection is the same in all burn-in boards 20, so that only one connection is shown and others are omitted in FIG. 10.

Figure 5:
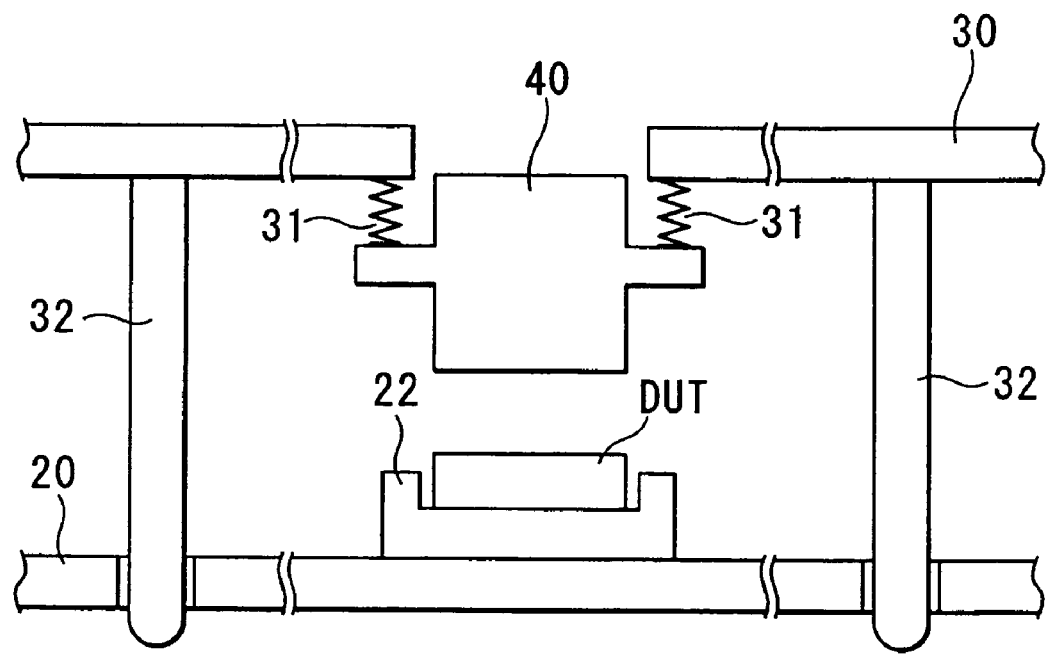
FIG. 5 is an enlarged view from the front of a key part of a temperature adjustment board installed in a burn-in chamber.

As shown in FIG. 4, in the burn-in chamber 10, temperature adjustment boards 30 are provided at upper positions of the respective slots 11. As shown in FIG. 5, temperature adjustment arrays 40 are attached to the temperature adjustment board 30 via springs 31, and the temperature adjustment arrays 40 can approach and recede from the temperature adjustment board 30. Each of the temperature adjustment arrays 40 is used for adjusting a temperature of the DUT and provided with a heat block, a cool block for circulating a coolant and a temperature sensor block (all not shown). Also, the temperature adjustment arrays 40 are arranged to be immediately above the DUT mounted on the inserted burn-in board 20 (refer to FIG. 5). At the time of a burn-in test, the temperature adjustment arrays 40 perform temperature control of heating or cooling DUT in a state of contacting with the DUT by being pressed against them with a predetermined pressing force.

On both ends of the temperature adjustment board 30, alignment pins 32 are provided. As a result that the pins 32 are inserted to holes formed on the burn-in board 20 while being guided, the temperature adjustment board 30 and the burn-in board 20 are aligned.

Figure 10:
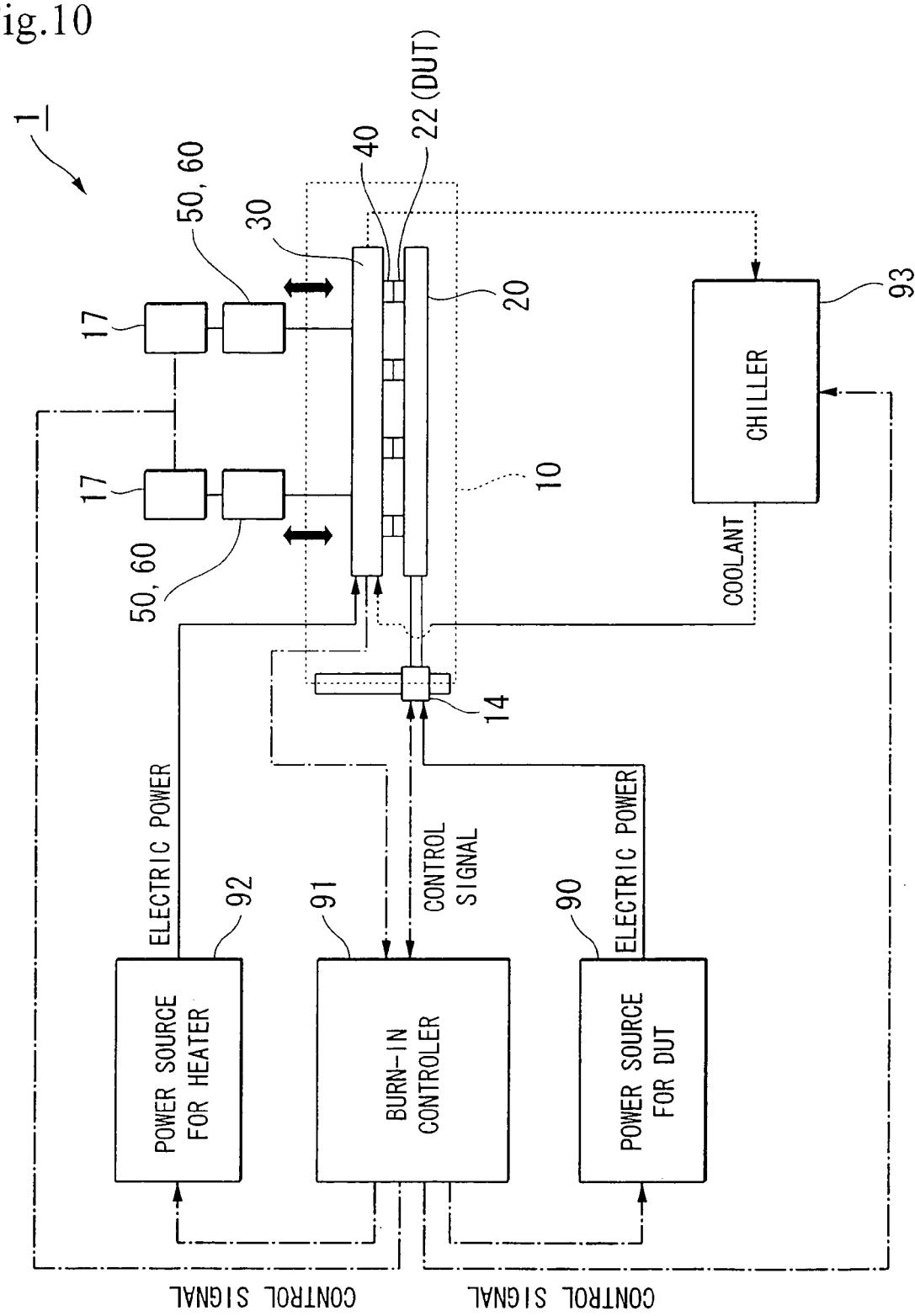
FIG. 10 is a conceptual diagram of a system configuration of the burn-in apparatus in outline.
Figure 11:
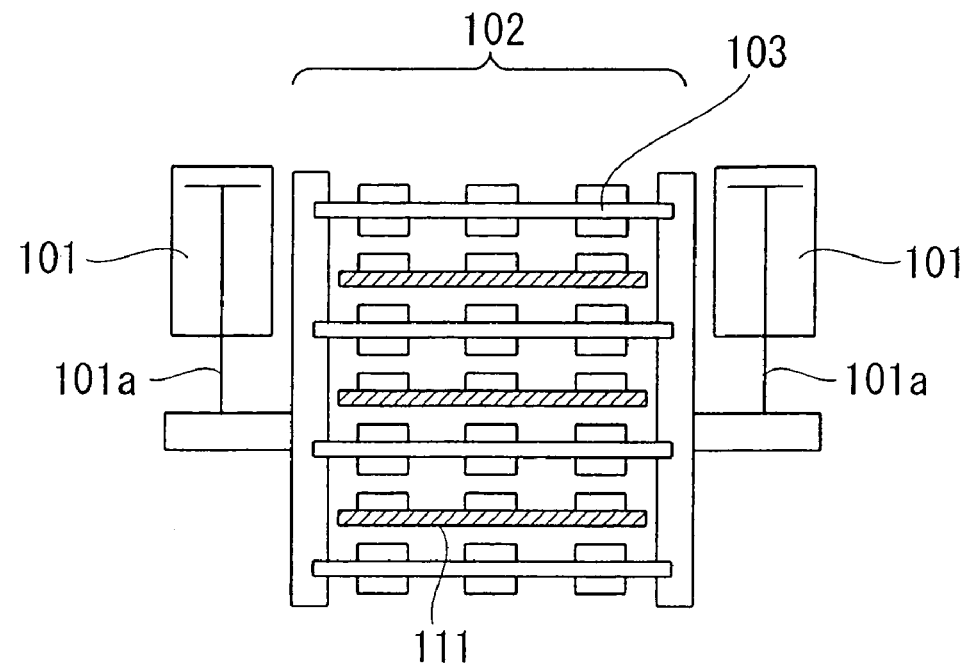
FIG. 11 is a conceptual diagram of the configuration of an elevator mechanism of a temperature adjustment board of the related art in outline.
Figure 12:
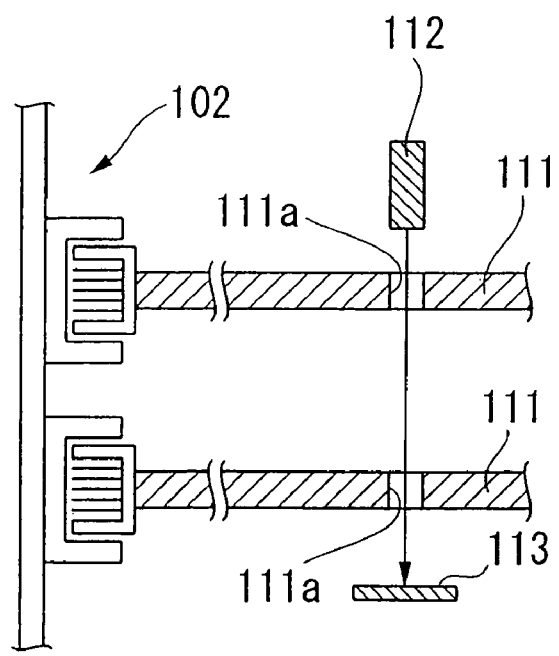
FIG. 12 is a conceptual diagram of the configuration of a detector of the related art in outline.

As shown in FIG. 10, the temperature adjustment arrays 40 are electrically connected to the heater power source 92 and the burn-in controller 91. An explanation on the support configuration of respective blocks of the temperature adjustment arrays 40 and a coolant supply path, etc. between the cool block and a chiller 93, etc. will be omitted. Also, the electrical connection state is the same in all temperature adjustment boards 40, so that only one is illustrated and others are omitted in FIG. 10.

As shown in FIG. 4, both side rims of the temperature adjustment board 30 are supported by the elevator plates 15 provided to be able to be freely elevated and lowered. Both of the elevator plates 15 are moved up and down by air cylinders 17 provided on both sides of the burn-in chamber 10 so as to be able to move up and down with respect to the burn-in chamber 10 by being guided by the elevator guides 16.

Figure 6:
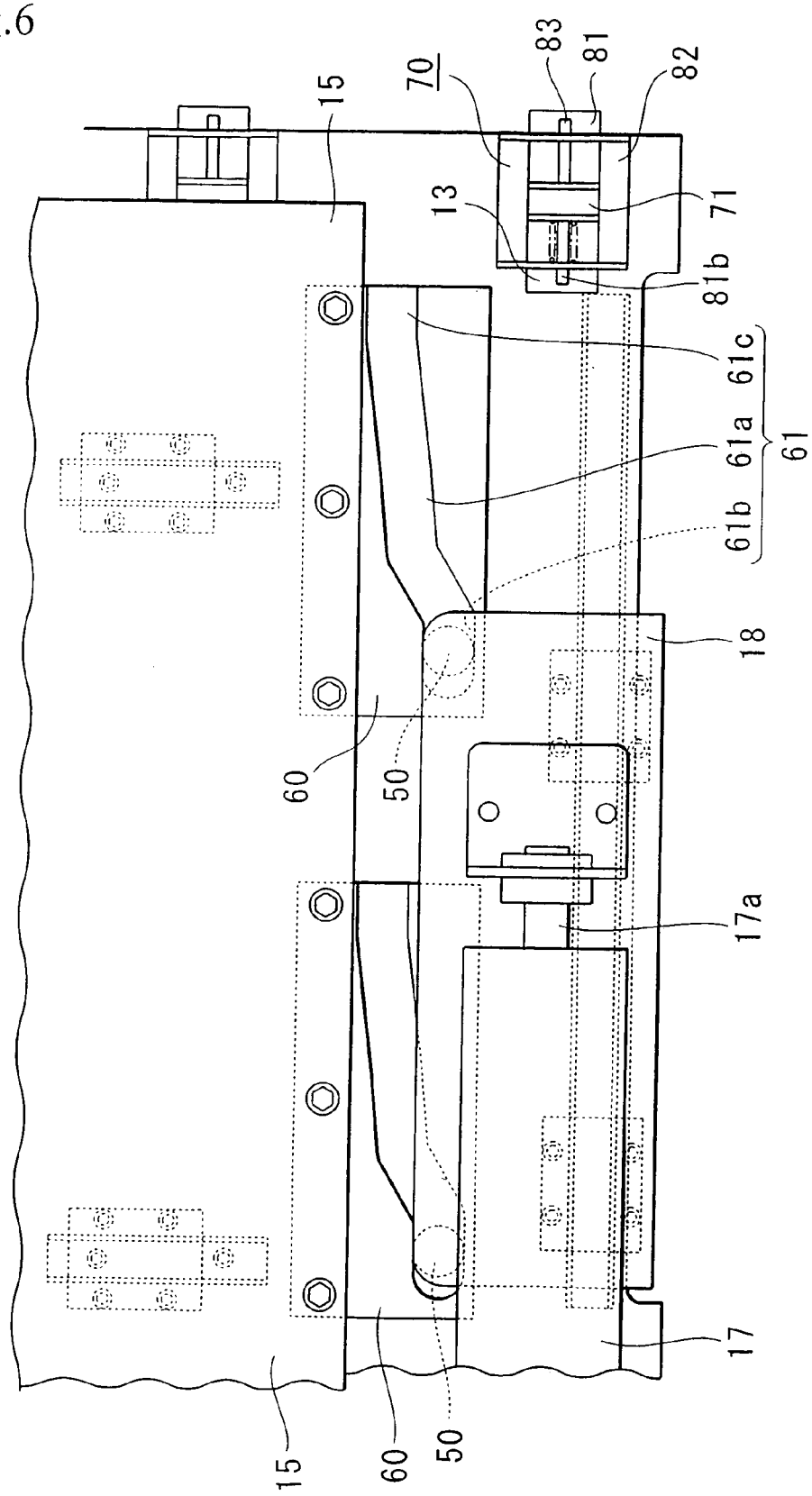
FIG. 6 is a side view of a mechanism for elevating/lowering the temperature adjustment board installed in the burn-in chamber of the burn-in apparatus in FIG. 1.
Figure 7:
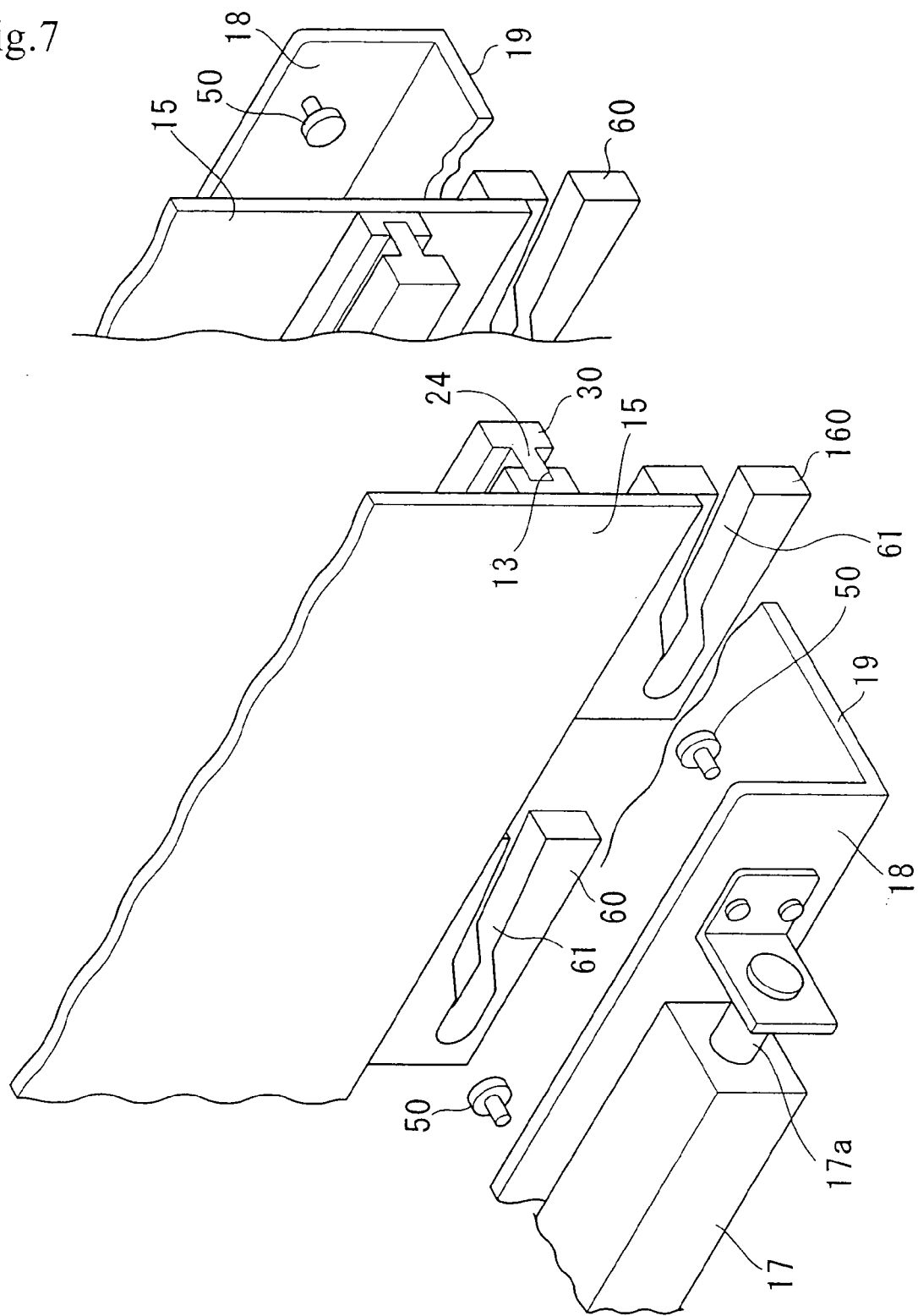
FIG. 7 is a disassembled perspective view of the mechanism for elevating/lowering the temperature adjustment board.

As shown in FIG. 6, the air cylinder 17 is provided in a state that a rod 17a (moving body) driven by air protrudes toward the open side (the right side in FIG. 6) of the front of the burn-in chamber 10, and the rod 17a can move back and forth. As shown in FIG. 7, the rod 17a is connected to a back-and-forth plate 18 provided to be movable back and forth. The back and forth movement of the back-and-forth plate 18 is converted to an up and down movement by a cam mechanism comprising a cam follower 50 and a tilted cam 60, so that the elevator plate 15 can be elevated or lowered. Note that the arrangement states are the same in both of the air cylinders 17, so that an explanation on the other will be omitted. Here, if desired, other drive source than the air cylinder, for example, oil hydraulic cylinder and an actuator, etc. may be also used.

As shown in FIG. 7, two cam followers 50 incorporate ball bearings and attached to the back-and-forth plate 18. The tilted cam 60 is attached to the elevator plate 15. In the present embodiment, the cam followers 50 are moved back and forth by the air cylinders 17, and the tilted cam 60 moved vertically elevates and lowers the elevator plates 15, so that the cam followers 50 are main driving side members of the cam mechanism and the tilted cam 60 is a driven side member of the cam mechanism.

The tilted cam 60 has a grooved cam 61. The grooved cam 61 includes a tilted part (grooved cam tilted part) 61a in a tilted state, a first horizontal part 61b continuing to a lower side end portion of the tilted part 61a and a second horizontal part 61c continuing to the upper end portion. Among them, the tilted part 61a has a rising gradient toward the front (the front open side of the burn-in chamber). A tilted angle of the tilted part 61a is made to be an angle for obtaining a desired driving magnification of, for example, 5 to 10 times or more of a driving force of the air cylinder 17. In the present embodiment, a larger driving force can be obtained as above, so that a compact air cylinder 17 can be applied.

On the other hand, the cam follower 50 moving in the grooved cam 61 has a cylindrical shape, attached to be freely rotatable to the back-and-forth plate 18 and moves in the grooved cam 61 while rotating. By using such a cam follower 50, back and forth movement of the cam follower 50 can be smoothly converted to a vertical movement of the tilted cam 60 efficiently. Accordingly, a compact air cylinder 17 can be used as the push-pull device. By using a compact air cylinder, a space can be saved in the burn-in chamber 10 including the air cylinder 17, so that the burn-in apparatus can be also downsized. Also, since the vertical movement of the tilted cam is smooth, the elevator plate can be elevated or lowered smoothly.

In the cam mechanism wherein a tilted part 61a of the tilted cam 60 has rising gradient toward the front as explained above, the tilted cam 60 moves downward when the cam follower 50 moves ahead and the elevator plates 15 and a plurality of temperature adjustment boards 30 supported thereby collectively move downward. Therefore, when the cam follower 50 positions at the first horizontal part 61b, the elevator plate 15 and the temperature adjustment boards 30 position at the uppermost position. While when the cam follower 50 positions at the second horizontal part 61c, the elevator plate 15 and the temperature adjustment boards 30 position at the lowermost position.

As shown in FIG. 4, the air cylinders 17, the cam mechanisms composed of cam followers 50 and the tilted cam 60, and the back-and-forth plates 18 are arranged on both sides of the burn-in chamber 10, respectively. Among them, the back-and-forth plates 18 on both sides are mutually connected by a connection member 19 arranged on the bottom of the burn-in chamber 10. Consequently, even when operations of rods 17a of the both air cylinders 17 vary, both cam followers 50 of the both back-and-forth plates 18 are synchronized to move back and forth. When the both cam followers 50 move in synchronization, the tilted cams 60 and the elevator plates 15 elevate/lower in a stable state, and the temperature adjustment boards 30 can be moved vertically in a more stable state.

Figure 8:
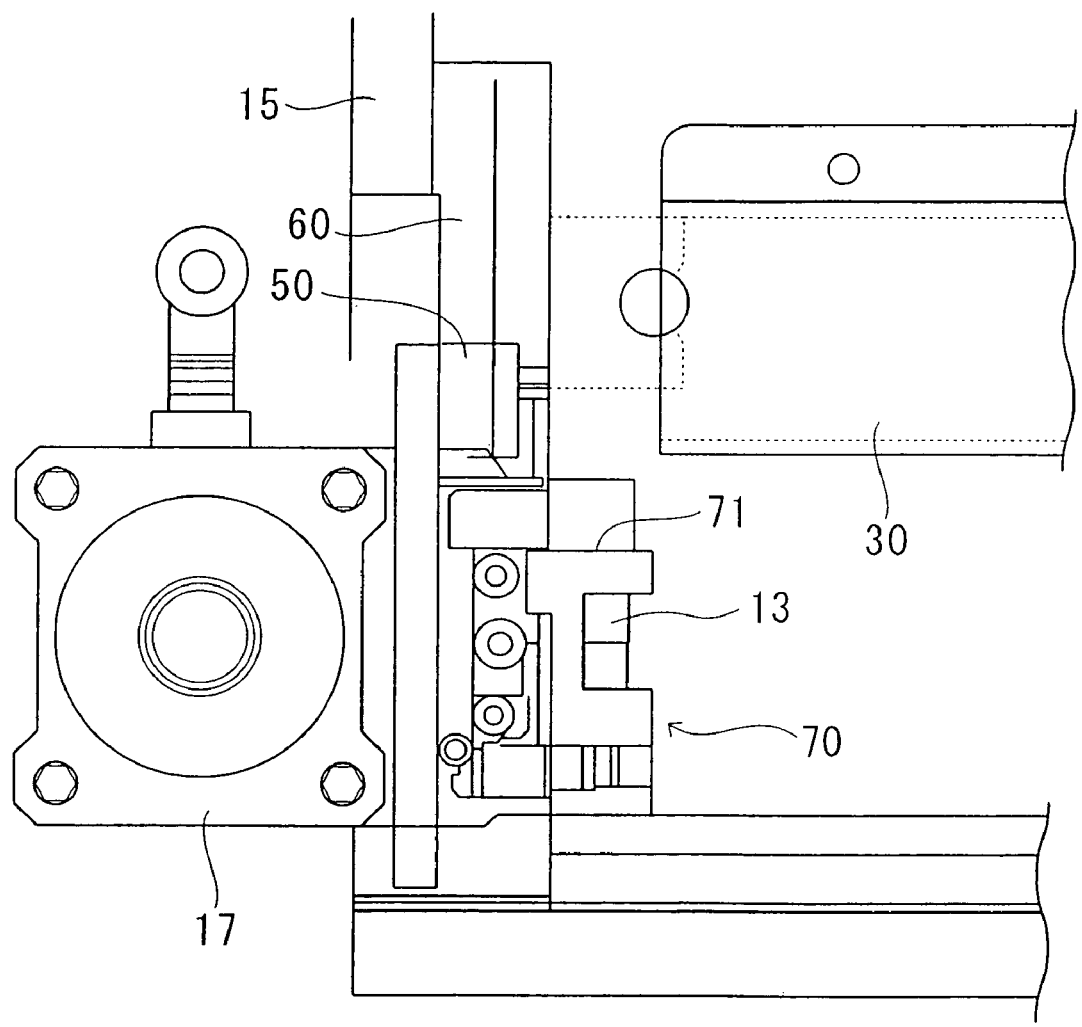
FIG. 8 is an enlarged view from the front of a part where a detector is installed in the burn-in apparatus in FIG. 1.

As shown in FIG. 6 and FIG. 8, each guide groove 13 of the burn-in chamber 10 has a detector 70 buried therein for detecting a position of a burn-in board 20 inserted to the slot 11. Namely, in the burn-in apparatus 1 of the present embodiment, the detector 70 is provided to every burn-in board 20 to be inserted. As shown in FIG. 6, the detector 70 is provided at a position close to the front face of the burn-in board 20 and detects a position of the burn-in board 20 by detecting a slit 24a (refer to FIG. 3) formed on the flange 24 of the burn-in board 20.

Figure 9:
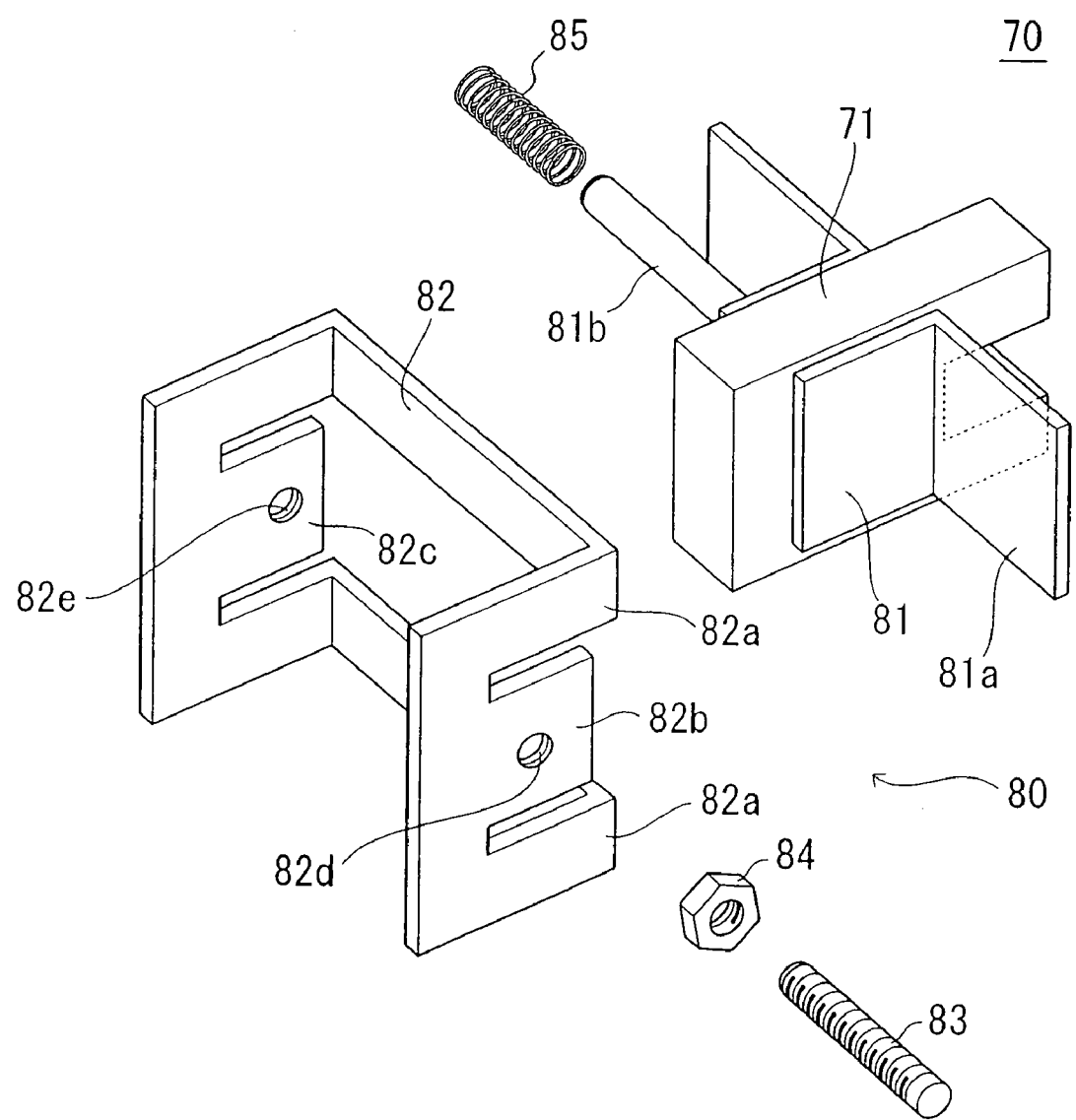
FIG. 9 is a disassembled perspective view of a detector of the burn-in apparatus in FIG. 1.

As shown in FIG. 8 and FIG. 9, the detector 70 has a detection unit 71 having a two-forked tip. The detection unit 71 is a photo micro sensor of a type that turns on when a light enters, provided with a light irradiating portion and a light receiving portion. Accordingly, in a state where a burn-in board 20 is inserted to a slot 11 of the burn-in chamber 10, a position of the slit 24a of the burn-in board 20 matches with a light path position from the light irradiating portion and, when the light passes the slit 24a to reach the light receiving portion, the photo micro sensor turns on. Also, when the burn-in board 20 is not inserted, the photo micro sensor is always in a turned on state.

As shown in FIG. 9, the detector 70 has a position adjustment mechanism 80 of the detection unit 71. The position adjustment mechanism 80 is used for adjusting a position of the detection unit 71 with respect to the inserting direction of the burn-in board 20, that is, in the back-and-forth moving direction and comprises a pair of sliders 81 attached to the detection unit 71 and a guide member 82 for guiding the sliders 81 to be movable in the back-and-forth moving direction. The slider 81 is an L-shaped member when seen planar attached to both of the front face side and back face side of the back-and-forth direction of the detection unit 71. The slider 81 has a slide plate 81a arranged vertically, and an upper rim and lower rim of the slide plate 81a extend in the back-and-forth moving direction. The guide member 82 has a guide portion 82a for contacting upper and lower ends of the slide plate 81a to be able to slide. As explained above, the detection unit 71 is supported by the sliders 81 and the guide member 82 to be in a freely movable state in the back-and-forth direction.

The guide member 82 has a front plate 82b and rear plate 82c arranged to sandwich the detection unit 71 from its front and back sides. A screw hole 82d is formed on the front plate 82b. In the screw hole 82d, a feeding screw (aligning jig) 83 to hit the detection unit 71 is screwed. Also, the feeding screw 83 is attached with a nut 84 for position fixing, so that the feeding screw 83 can be fixed at any position. The feeding screw 83 has a sharp tip. On the other hand, a guide hole 82e is formed on the rear plate 82c. In the guide hole 82e, a shaft 81b fixed to the slider 81 on the back side of the detection unit 71 is inserted to be able to slide freely, and a coil spring 85 is extrapolated to the shaft 81*b*. The coil spring 85 is sandwiched in a compressed state by the slider 81 on the back side of the detection unit 71 and the rear plate 82*c* of the guide member 82 and biases the detection unit 71 to the front.

As explained above, the detection unit 71 is sandwiched by the feeding screw 83 on the front side and the coil spring 85 on the rear side and aligned to be a position set by the feeding screw 83. By adjusting a screwing position of the feeding screw 83, a position of the detection unit 71 in the back-and-forth direction can be adjusted. Note that, as explained above, the photo micro sensor 71 is formed to include a light irradiating portion and light receiving portion as one body, and adjustment of positional relationship of a light irradiating direction and the light receiving position is not necessary.

Next, an operation of the burn-in apparatus 1 at the time of bringing the temperature adjustment arrays 40 contact DUT will be explained. Note that an explanation of a burn-in test conducted in a state where the temperature adjustment arrays 40 contact the DUT will be omitted.

First, the air cylinders 17 are brought to be in a state where the temperature adjustment board 30 does not press against the burn-in board 20, the door of the burn-in chamber 10 (refer to FIG. 1) is opened, the burn-in board 20 mounted with the DUT is inserted to the slot 11 of the burn-in chamber 10. Note that, even in the case of a small number of DUT and not using all slots 11, the detectors 70 of the present embodiment are photo micro sensors of a type that turns on when a light enters, so that it is not necessary to insert dummy burn-in boards to unused slots 11.

When inserting the burn-in boards 20 and closing the door of the burn-in chamber 10, the detectors 70 detect positions of the burn-in boards 20. The detectors 70 detect positions of slits 24*a* of the burn-in boards 20. Also, since the detectors 70 are photo micro sensors to be turned on when a light enters, the detectors 70 sends an on-signal only when a light from the light irradiating portion passed through the slits 24*a* is received by the light receiving portion. When there is a detector 70 not sending an on-signal, the corresponding burn-in board 20 may not be fully inserted, for example, not inserted surely to the end. In that case, an insertion state of the corresponding burn-in board 20 is checked and the board is inserted surely.

Note that, in the burn-in apparatus according to the present embodiment, a signal from each detector 70 is detected and only when on-signals are sent from all detectors 70, the air cylinders 17 can drive, so that the detectors 70 also serve as safety devices. When on-signals are sent from all detectors 70 to enable the air cylinders 17 to drive, by turning on an operation switch, all temperature adjustment boards 30 positioned at the uppermost positions move downward by the air cylinders 17. As a result, all temperature adjustment arrays 40 attached to the temperature adjustment boards 30 are pressed against and brought to contact with facing all DUT via the springs 31.

Here, an elevating/lowering operation of the temperature adjustment boards 30 will be explained in detail. When insertion of the burn-in boards 20 is completed, the temperature adjustment boards 30 are positioned at the uppermost positions in a state without any pressing (refer to FIG. 5). In that state, rods 17*a* of both of the air cylinders 17 are receded to the direction of the back face of the burn-in chamber 10.

From that state, both rods 17*a* of the air cylinders 17 are moved forward to move both cam followers 50 of both back-and-forth plates 18 forward. The back-and-forth plates 18 are integrally connected by a connection plate 19 and the cam followers 50 smoothly move forward in a synchronized state. Consequently, the cam followers 50 roll on a surface of the tilted cam 60 to move forward in the horizontal direction and the tilted cam 60 moves downward.

The cam followers 50 contacts with the tilted cam 60 by rolling and the friction is small, so that outputs of the air cylinders 17 are transferred efficiently to the elevator plate 15 side. An upward move distance of the tilted cam 60 is shorter than the forward move distance of the cam followers 50. As explained above, when a movement of the cam followers 50 is converted to be slow and transferred by the cam mechanism, the elevator plates 15 and the temperature adjustment boards 30 can be moved up and down in a more stable state. Also, by using the decelerating cam mechanism, a small driving force can be converted to a large force to move up and down, so that a compact air cylinder can be used, consequently, the burn-in apparatus can be downsized.

When the tilted cam 60 moves downward, the elevator plate 15 fixed to the tilted cam 60 moves downward integrally, and the temperature adjustment board 30 moves downward. Then, the temperature adjustment arrays 40 touch DUT a little before the cam followers 50 reach the front end of the grooved cam tilted part 61*a*. The temperature adjustment arrays 40 are supported by the temperature adjustment boards 30 via the springs 31 and contact the DUT evenly. The cam followers 50 are furthermore moved forward from that state to the second horizontal part 61*c*. When the cam followers 50 are moved to the second horizontal part 61*c*, the temperature adjustment arrays 40 become to be in a state of being pressed against the DUT. A burn-in test is conducted in a state where the temperature adjustment arrays 40 are pressed against the DUT as such.

Here, when the cam followers 50 position at the second horizontal part 61*c*, a state of pressing the temperature adjustment arrays 40 against the DUT can be maintained mechanically due to the configuration of the cam mechanism in a horizontal state. Accordingly, even when a problem arises that an air pressure supplied to the air cylinders 17 becomes zero, the DUT are kept under a pressed state as above and high reliability is obtained.

If the cam followers 50 are moved to the second horizontal parts 61*c*, a push back force by the DUT upward against the temperature adjustment arrays 40 is added to all cam followers 50 as an upward pressing force by the tilted cam 60 to the cam followers 50 in the cam mechanism. Namely, a force of moving the cam followers 50 in the back-and-force moving direction is not added to the cam followers 50, and it becomes unnecessary to always impose a force on the cam followers 50 by the air cylinders 17. If a force of the air cylinders 17 is not necessary when keeping the positions of the temperature adjustment board 30 as explained above, even in the case where an air supply of the air cylinders 17 is erroneously cutoff during the test, since the temperature adjustment board 30 normally presses the DUT, damages of the DUT or incorrect test results due to abnormal temperature rise of the DUT are not prevented, and reliability of the burn-in apparatus 1 improves. Furthermore, the burn-in tests are usually conducted for several to several tens of hours continuously, but when drive of the air cylinders 17 is stopped during the time, the tests are not interfered.

After finishing the long burn-in tests, by operating a switch of the air cylinders 17, the air cylinders 17 are activated to move the cam followers 50 to be receded. As a result, the tilted cams 60 move upward and the temperature adjustment boards 30 move upward. Consequently, the temperature adjustment arrays 40 moves upward to be away from the DUT. From that state, the cam followers 50 are furthermore receded to move to the first horizontal part 61*b*. As a result, the elevator plates 15 and the temperature adjustment arrays 40 position at the uppermost positions. Then, the switch of the air cylinders 17 is turned off. When the cam followers 50 are moved to the first horizontal part 61*b*, the elevator plates 15 are mechanically kept at the uppermost position due to the configuration of the cam mechanism even though a force is not given to the cam follower 50 by the air cylinders 17, so that the safety is secured.

As explained above, since the horizontal parts 61*b* and 61*c* are provided at both end portions of the groove cam tilted part 61*a*, by placing the cam followers 50 there, even if the air pressure becomes zero by turning off the switch of the air cylinders 17, it is possible to keep the state of pressing the temperature adjustment arrays 40 against the DUT and the state of keeping them at the uppermost position.

Next, positional adjustment of the detection unit of the detector in the burn-in apparatus will be explained.

When adjusting a position of the detection unit 71 of the detector 70, the burn-in board 20 to be used in the burn-in test is surely inserted to the slot 11 of the burn-in chamber 10 attached with the detection unit 71, whose position is to be adjusted. In that state, first, a nut 84 for fixing the feeding screw 83 to the guide member 82 is loosen. Next, a position of screwing the feeding screw 83 is adjusted so that the detector 70 sends an on-signal at the center position of the groove of the slit 24*a* or at a desired position.

The detection unit 71 is biased by the coil springs 85, so that the detection unit 71 moves in the back-and-forth moving direction while keeping a state of contacting with a tip of the feeding screw 83. As explained above, in the present embodiment, since a position of the detection unit 71 can be finely adjusted, the detection unit 71 can be aligned to be an optimal position for each slot. Also, as in the present embodiment, when the feeding screw has a sharp tip and the sharp tip is brought to contact with the detection unit side in a state of being held in a recess formed on the detection unit side, fine adjustment becomes more easy. After adjusting the position of the detection unit 71 as a photo micro sensor by these methods, the feeding screw 83 is fastened by the nut 84 to the guide member 82 and the position of the detection unit 71 is fixed.

By determining the position of the detection unit 71 as explained above, the detection units 71 can be arranged at desired positions for the respective slots, so that position detection of the burn-in boards 20 can be surely performed.

The present invention is extremely useful in a burn-in apparatus for elevating/lowering a plurality of temperature adjustment boards collectively. According to the burn-in apparatus of the present invention, a push-pull device for elevating/lowering the temperature adjustment board can be downsized, so that a compact burn-in apparatus can be provided. Also, position can be detected at an optimal position by an individual detector for each burn-in board housed in the burn-in chamber, so that stable position determination of the burn-in boards housed in the burn-in chamber can be realized.

What is claimed is:

1. A burn-in apparatus comprising:
   a burn-in chamber for housing a burn-in board mounted with a plurality of electronic devices to be tested;
   a temperature adjustment board having a plurality of temperature adjustment arrays for heating/cooling said electronic devices by pressing and contacting said electronic devices; and
   an elevator device for moving said temperature adjustment board up and down in said burn-in chamber and for moving said temperature adjustment board in the direction of said burn-in board to bring said temperature adjustment arrays in contact with said electronic devices by pressing against them so that a burn-in test is performed
   said elevator device includes a push-pull device having a movable body which moves back and forth in the horizontal direction and a cam mechanism including a tilted cam and a cam follower for converting a back-and-forth movement of said movable body to a vertical movement to move said temperature adjustment board up and down,
   the tilted cam of said cam mechanism has a grooved cam tilted part for converting the back-and-forth movement to the vertical movement by cooperating with said cam follower, a first horizontal part continuing from one end of the grooved cam tilted part and extending in the horizontal direction is formed at one of both ends of said grooved cam tilted part on the side where said cam follower positions when a driven side member of the vertically movable cam mechanism positions at the uppermost position.

2. The burn-in apparatus as set forth in claim 1, wherein said push-pull device and said cam mechanism are respectively provided on both sides of said burn-in chamber, a movable body of said push-pull device is attached with at least one main driving side member of said cam mechanism moving back and forth in the horizontal direction, and a main driving side member connected to one movable body and a main driving side member connected to the other movable body are mutually connected by a connection member provided to be able to move back and forth in the horizontal direction.

3. The burn-in apparatus as set forth in claim 1, wherein the cam follower of said cam mechanism contacts a surface of a grooved cam of said tilted cam by rolling thereon.

4. A burn-in apparatus comprising:
   a burn-in chamber for housing a burn-in board mounted with a plurality of electronic devices to be tested;
   a temperature adjustment board having a plurality of temperature adjustment arrays for heating/cooling said electronic devices by Pressing and contacting said electronic devices; and
   an elevator device for moving said temperature adjustment board up and down in said burn-in chamber and for moving said temperature adjustment board in the direction of said burn-in board to bring said temperature adjustment arrays in contact with said electronic devices by pressing against them so that a burn-in test is performed
   said elevator device includes a push-pull device having a movable body which moves back and forth in the horizontal direction and a cam mechanism including a tilted cam and a cam follower for converting a back-and-forth movement of said movable body to a vertical movement to move said temperature adjustment board up and down,
   the tilted cam of said cam mechanism has a grooved cam tilted part for converting the back-and-forth movement to the vertical movement by cooperating with said cam follower, a horizontal part continuing from one end of the grooved cam tilted part and extending in the horizontal direction is formed at one of both ends of said grooved cam tilted part on the side where said cam follower positions when a driven side member of the vertically movable cam mechanism positions at the lowermost position.

5. The burn-in apparatus as set forth in claim 4, wherein said push-pull device and said cam mechanism are respectively provided on both sides of said burn-in chamber, a movable body of said push-pull device is attached with at least one main driving side member of said cam mechanism moving back and forth in the horizontal direction, and a main driving side member connected to one movable body and a main driving side member connected to the other movable body are mutually connected by a connection member provided to be able to move back and forth in the horizontal direction.

6. The burn-in apparatus as set forth in claim 4, wherein the cam follower of said cam mechanism contacts a surface of a grooved cam of said tilted cam by rolling thereon.

7. A burn-in apparatus comprising a burn-in chamber for housing a plurality of burn-in boards mounted with a plurality of electronic devices to be tested, detectors for detecting positions of said burn-in boards at a predetermined position, a temperature adjustment board freely movable in the vertical direction, a plurality of temperature adjustment arrays attached to said temperature adjustment board; an elevator device for moving said temperature adjustment board in the direction of said burn-in board to bring said temperature adjustment arrays in contact with said electronic devices to be tested;
wherein said detectors are provided to be in one-to-one correspondence with respective burn-in boards to be housed in said burn-in chamber, and each individual detector performs position detection of each burn-in board.

8. The burn-in apparatus as set forth in claim 7, wherein a detector for detecting an insertion position of said burn-in board is a photo micro sensor comprising a light irradiating portion and a light receiving portion.

9. The burn-in apparatus as set forth in claim 8, wherein said photo micro sensor is a type that turns on when a light enters.

10. The burn-in apparatus as set forth in claim 8, wherein said photo micro sensor detects a position of a notch or a through hole formed on a burn-in board.

11. The burn-in apparatus as set forth in claim 7, wherein a position of setting said detector is close to an opening of a burn-in board slot provided to said burn-in chamber.

12. The burn-in apparatus as set forth in claim 7, wherein a position of said detector can be adjusted.

13. The burn-in apparatus as set forth in claim 7, comprising position adjustment mechanisms respectively coupled said detectors, wherein each of the position adjustment mechanisms includes a slider attached to a respective one of said detectors, a guide member for guiding said slider to move back and forth, a jig for alignment able to be fixed to said guide member in a state of being relatively movable back and forth with respect to said guide member and made to hit the respective one of said detectors, and a biasing means for biasing the respective one of said detectors toward said jig;
wherein, when a relative position of said jig hitting the respective one of said detectors with respect to the guide member is adjusted, a position of the respective one of said detectors in the back-and-forth direction is adjusted.

14. The burn-in apparatus as set forth in claim 13, wherein said jig for alignment is a feeding screw screwed with said guide member and a tip thereof is to be the respective one of said detectors and, when a position of screwing said feeding screw on the guide member is adjusted, a position of the respective one of said detectors in the back-and-forth direction is adjusted.

15. A burn-in apparatus for conducting a test by housing in a burn-in chamber a plurality of burn-in boards capable of mounting a plurality of electronic devices to be tested, a temperature adjustment board having a plurality of temperature adjustment arrays for heating/cooling said electronic devices by pressing and contacting said electronic devices, and an elevator device for moving said temperature adjustment board up and down, wherein
said temperature adjustment arrays are arranged on said temperature adjustment board to face said electronic devices to be tested in an arrangement corresponding to an arrangement of said electronic devices so as to be able to heat/cool said electronic devices individually,
said elevator device comprises a push-pull device having a movable body for moving back and forth by a drive source and a cam mechanism for converting a drive force in the back-and-forth direction of said movable body, moves said temperature adjustment board in said burn-in board direction by a drive force converted by said cam mechanism and brings said temperature adjustment arrays press against said electronic devices to contact them,
said cam mechanism converts a drive force of said movable body in the back-and-forth direction to a direction perpendicular to the back-and-forth direction and drives an elevator plate by a converted drive force,
said elevator plate moves said temperature adjustment board back and forth with respect to said burn-in board, and
said cam mechanism includes a tilted cam and a cam follower,
the tilted cam of said cam mechanism has a grooved cam tilted part for converting the back-and-forth movement to the vertical movement by cooperating with said cam follower; a first horizontal part continuing from one end of the grooved cam tilted part and extending in the horizontal direction is formed at one of both ends of said grooved cam tilted part on the side where said cam follower positions when a driven side member of the vertically movable cam mechanism positions at the uppermost position.

16. The burn-in apparatus as set forth in claim 15, wherein an alignment pin is provided to said temperature adjustment board for mutually aligning said temperature adjustment board with said burn-in board, and said burn-in board is provided with a guide hole for guiding said alignment pin to fit therein.

17. The burn-in apparatus as set forth in claim 15, wherein an elastic body is provided between said temperature adjustment board and said temperature adjustment arrays, so that said temperature adjustment arrays elastically press electronic devices to be tested when said temperature adjustment board approaches said burn-in board.

18. The burn-in apparatus as set forth in claim 15, wherein; said burn-in chamber comprises a guide groove for guiding said burn-in board to a predetermined housing position and a fitting connector for said housed burn-in board to electrically connect; said burn-in board comprises flanges guided by said guide groove on its both sides and a connector for fitting with said fitting connector, and a slit is formed on said flanges; and a detector for detecting that said connector of said burn-in board surely fits with said fitting connector of said burn-in chamber by detecting said slit of said burn-in board housed in said burn-in chamber.

19. The burn-in apparatus as set forth in claim 18, wherein said detector is capable of adjusting a detection position of said slit with respect to a position of said slit.

20. The burn-in apparatus as set forth in claim 15, wherein said temperature adjustment array is provided with a configuration of cooling the temperature adjustment array by circulating a coolant from the outside and a configuration of heating the temperature adjustment array by a built-in heater.

21. The burn-in apparatus as set forth in claim 20, wherein said temperature adjustment array furthermore comprises a temperature sensor, controls one or both of said heater and a flow amount of said coolant based on said temperature sensor, and cools or heats a temperature of a part of the temperature adjustment array contacting with an electronic device to be tested to a predetermined temperature.

22. A burn-in apparatus for conducting a test by housing in a burn-in chamber a plurality of burn-in boards capable of mounting a plurality of electronic devices to be tested, a temperature adjustment board having a plurality of temperature adjustment arrays for heating/cooling said electronic devices by pressing and contacting said electronic devices, and an elevator device for moving said temperature adjustment board up and down, wherein
said temperature adjustment arrays are arranged on said temperature adjustment board to face said electronic devices to be tested in an arrangement corresponding to an arrangement of said electronic devices so as to be able to heat/cool said electronic devices individually,
said elevator device comprises a push-pull device having a movable body for moving back and forth by a drive source and a cam mechanism for converting a drive force in the back-and-forth direction of said movable body, moves said temperature adjustment board in said burn-in board direction by a drive force converted by said cam mechanism and brings said temperature adjustment arrays press against said electronic devices to contact them,
said cam mechanism converts a drive force of said movable body in the back-and-forth direction to a direction perpendicular to the back-and-forth direction and drives an elevator plate by a converted drive force, said elevator plate moves said temperature adjustment board back and forth with respect to said burn-in board,
said cam mechanism includes a tilted cam and a cam follower, and
the tilted cam of said cam mechanism has a grooved cam tilted part for converting the back-and-forth movement to the vertical movement by cooperating with said cam follower; a horizontal part continuing from one end of the grooved cam tilted part and extending in the horizontal direction is formed at one of both ends of said grooved cam tilted part on the side where said cam follower positions when a driven side member of the vertically movable cam mechanism positions at the lowermost position.

23. The burn-in apparatus as set forth in claim 22, wherein an alignment pin is provided to said temperature adjustment board for mutually aligning said temperature adjustment board with said burn-in board, and said burn-in board is provided with a guide hole for guiding said alignment pin to fit therein.

24. The burn-in apparatus as set forth in claim 22, wherein an elastic body is provided between said temperature adjustment board and said temperature adjustment arrays, so that said temperature adjustment arrays elastically press electronic devices to be tested when said temperature adjustment board approaches said burn-in board.

25. The burn-in apparatus as set forth in claim 22, wherein; said burn-in chamber comprises a guide groove for guiding said burn-in board to a predetermined housing position and a fitting connector for said housed burn-in board to electrically connect; said burn-in board comprises flanges guided by said guide groove on its both sides and a connector for fitting with said fitting connector, and a slit is formed on said flanges; and a detector for detecting that said connector of said burn-in board surely fits with said fitting connector of said burn-in chamber by detecting said slit of said burn-in board housed in said burn-in chamber.

26. The burn-in apparatus as set forth in claim 22, wherein said temperature adjustment array is provided with a configuration of cooling the temperature adjustment array by circulating a coolant from the outside and a configuration of heating the temperature adjustment array by a built-in heater.

* * * * *